United States Patent
Zhai et al.

(10) Patent No.: US 11,742,839 B2
(45) Date of Patent: Aug. 29, 2023

(54) LOCAL OSCILLATOR DIVIDER WITH REDUCED APPLIED CURRENT VARIATION

(71) Applicant: QUALCOMM Incorporated, San Diego, CA (US)

(72) Inventors: Chen Zhai, San Diego, CA (US); Yung-Chung Lo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 60 days.

(21) Appl. No.: 17/403,863

(22) Filed: Aug. 16, 2021

(65) Prior Publication Data

US 2023/0049388 A1 Feb. 16, 2023

(51) Int. Cl.

| | |
|---|---|
| H04B 1/40 | (2015.01) |
| H03F 3/24 | (2006.01) |
| H03B 19/00 | (2006.01) |
| H03B 19/14 | (2006.01) |
| H03B 27/00 | (2006.01) |
| G06F 7/14 | (2006.01) |
| H03K 3/03 | (2006.01) |
| H03K 5/12 | (2006.01) |
| H03K 5/00 | (2006.01) |

(52) U.S. Cl.
CPC ......... *H03K 5/00006* (2013.01); *H03F 3/245* (2013.01); *H04B 1/40* (2013.01); *H03F 2200/165* (2013.01); *H03F 2200/294* (2013.01); *H03F 2200/451* (2013.01)

(58) Field of Classification Search
None
See application file for complete search history.

(56) References Cited

U.S. PATENT DOCUMENTS

| | | | |
|---|---|---|---|
| 9,531,323 B1* | 12/2016 | Khalili | H03B 5/1212 |
| 11,228,280 B1* | 1/2022 | Bahr | H03B 5/04 |
| 2008/0012651 A1* | 1/2008 | Nakamura | H03L 7/18 |
| | | | 331/18 |
| 2009/0256596 A1* | 10/2009 | Oh | H03K 23/667 |
| | | | 327/356 |
| 2009/0284288 A1 | 11/2009 | Zhang et al. | |
| 2011/0043291 A1 | 2/2011 | Fagg | |
| 2011/0156829 A1* | 6/2011 | Wang | H03L 7/0802 |
| | | | 331/117 FE |
| 2011/0234293 A1 | 9/2011 | Shanan | |

(Continued)

OTHER PUBLICATIONS

International Search Report and Written Opinion—PCT/US2022/038209—ISA/EPO—dated Nov. 21, 2022.

*Primary Examiner* — Pablo N Tran
(74) *Attorney, Agent, or Firm* — Loza & Loza, LLP/Qualcomm

(57) ABSTRACT

Aspects of the disclosure relate to a local oscillator frequency divider for a receiver or transmitter. In this regard a frequency divider has a first frequency input coupled to a first oscillator frequency output, a second frequency input coupled to a complementary second oscillator frequency output, a first in-phase/quadrature (I/Q) divided frequency output, and a complementary second I/Q divided frequency output. The frequency divider further has a first alternating current (AC) coupling capacitor between the first frequency input and the first oscillator frequency output and a second AC coupling capacitor between the second frequency input and the second oscillator frequency output.

15 Claims, 10 Drawing Sheets

(56) References Cited

U.S. PATENT DOCUMENTS

2018/0309406 A1* 10/2018 Yun ..................... H03B 5/1265
2022/0021361 A1* 1/2022 Vander Voorde ...... H03B 5/129
2022/0365551 A1* 11/2022 Sibeud ................... G06F 1/324

* cited by examiner

LOCAL OSCILLATOR DIVIDER WITH REDUCED APPLIED CURRENT VARIATION

TECHNICAL FIELD

Aspects of the present disclosure relate generally to a local oscillator frequency divider for a receiver or transmitter.

INTRODUCTION

Wireless communication devices and technologies are becoming ever more prevalent. Wireless communication devices generally transmit and receive communication signals. A communication signal is typically processed by a variety of different components and circuits. In some modern communication systems, a communication beam may be formed and steered in one or more directions. Frequency dividers are used to divide the frequency of an input clock to generate an output clock. Some frequency dividers may be part of a transit or receive chain of a radio system to generate suitable output clocks for upconversion or downconversion. The output clock may be applied to a mixer to convert data that is to be transmitted or received to or from a suitable intermediate or radio frequency. In other cases, a frequency divider is not part of a transmitter or receiver.

SUMMARY

The following presents a simplified summary of one or more aspects of the present disclosure in order to provide a basic understanding of such aspects. This summary is not an extensive overview of all contemplated features of the disclosure, and is intended to neither identify key or critical elements of all implementations nor to delineate the scope of any or all implementations. Its sole purpose is to present some concepts of one or more aspects of the disclosure in a simplified form as a prelude to the more detailed description that is presented later.

An aspect of the disclosure relates to an apparatus. The apparatus includes a frequency divider having a first frequency input coupled to a first oscillator frequency output, a second frequency input coupled to a complementary second oscillator frequency output, a first in-phase/quadrature (I/Q) divided frequency output, and a complementary second I/Q divided frequency output, and a first alternating current (AC) coupling capacitor between the first frequency input and the first oscillator frequency output and a second AC coupling capacitor between the second frequency input and the second oscillator frequency output.

In one implementation, a bias voltage source is coupled to the first frequency input between the AC coupling capacitor and the first frequency input through a first series resistance. A second bias voltage source may be coupled to the second frequency input between the second AC coupling capacitor and the second frequency input through a second series resistance, wherein a first bias voltage of the first bias voltage source and a second bias voltage of the second bias voltage source are independently regulatable. The first bias voltage source may be a current mirror having a variable reference current.

In another implementation, the frequency divider has a first I/Q section coupled to the first frequency input and to the second frequency input to generate the first I/Q divided frequency output. A third AC coupling capacitor is coupled between the second frequency input and a Q portion of the first I/Q section and a third bias voltage source is coupled to the second frequency input between the third AC coupling capacitor and the Q portion of the first I/Q section through a series resistance, wherein a bias voltage of the first bias voltage source and a third bias voltage of the third bias voltage source are independently regulatable.

Another implementation includes a first transistor of a first type, wherein the first frequency input comprises a gate of the first transistor, the first transistor being coupled to a supply voltage at a first transistor source and the frequency divider at a first transistor drain. The frequency divider includes a plurality of inverters coupled to each other and the first transistor drain is coupled to a bias current port of an inverter in an I portion of the frequency divider. The apparatus also includes a second transistor of a second type, wherein the second frequency input comprises a gate of the second transistor, the second transistor being coupled to the frequency divider at a second transistor drain and to ground at a second transistor source. The second transistor drain is coupled to a bias current of an inverter in a Q portion of the frequency divider.

Another aspect of the disclosure relates to a transceiver. The transceiver includes a digital to analog converter configured to convert data to be transmitted into I and Q analog output signals, a lowpass filter configured to remove undesired images from the I and Q output signals, an upconverter configured to upconvert the filtered I and Q output signals to a transmit frequency, and an amplifier configured to amplify the upconverted I and Q signals to transmit. The transceiver further includes a local oscillator signal generator coupled to the upconverter and configured to generate I and Q local oscillator signals for the upconverter, the local oscillator signal generator having a frequency divider having a plurality of oscillation inputs, a plurality of divided frequency outputs, and a plurality of alternating current (AC) coupling capacitors each connected to a respective input of the plurality of oscillator inputs.

Another aspect of the disclosure relates to a method. The method includes receiving a first local oscillator signal, coupling a first alternating current (AC) component of the first local oscillator signal to a first frequency input of a frequency divider through a first coupling capacitance, receiving a complementary second local oscillator signal, coupling a second AC component of the second local oscillator signal to a second frequency input of the frequency divider through a second coupling capacitance, dividing the first AC component to generate a first in-phase/quadrature (I/Q) divided frequency output, and dividing the second AC component to generate a complementary second I/Q divided frequency output.

Another aspect of the disclosure relates to a wireless communication device. The wireless communication device includes means for receiving a first local oscillator (LO) signal, means for coupling a first AC component of the first LO signal to a first frequency input of the apparatus through a first coupling capacitance. The apparatus further includes means for receiving a complementary second local oscillator signal and means for coupling a second AC component of the second local oscillator signal to a second frequency input of the frequency divider through a second coupling capacitance. The apparatus further includes means for dividing the first AC component to generate a first I/Q divided frequency output and means for dividing the second AC component to generate a complementary second I/Q divided frequency output.

These and other aspects of the present disclosure will become more fully understood upon a review of the detailed description, which follows. Other aspects, features, and embodiments of the present disclosure will become apparent to those of ordinary skill in the art, upon reviewing the following description of specific, example embodiments in conjunction with the accompanying figures. While features of the present disclosure may be discussed relative to certain embodiments and figures below, all embodiments of the present disclosure can include one or more of the advantageous features discussed herein. In other words, while one or more embodiments may be discussed as having certain advantageous features, one or more of such features may also be used in accordance with the various embodiments herein. In similar fashion, while example embodiments may be discussed below as device, system, or method embodiments it should be understood that such example embodiments can be implemented in various devices, systems, and methods.

DETAILED DESCRIPTION

Figure 1:
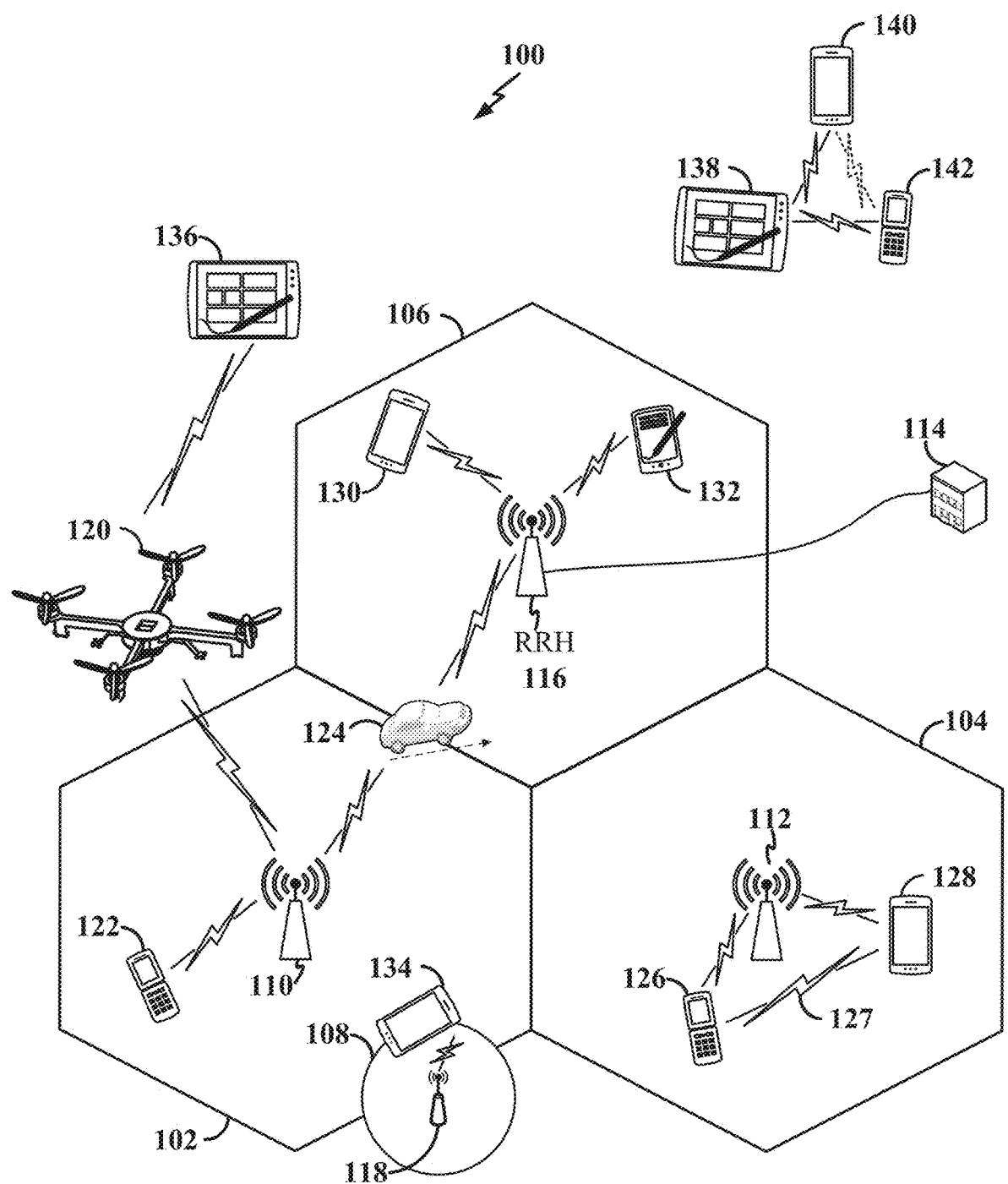
FIG. 1 illustrates a schematic diagram of a wireless device communicating with a wireless communication system in accordance with an aspect of the disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A frequency divider, such as a divide by 2 topology has tail transistors such as N-type Metal Oxide Semiconductor (NMOS) and P-type Metal Oxide Semiconductor (PMOS) transistors in which the DC (Direct Current) voltage of the tail transistors may be set by the voltage from a clock through an input buffer. In some cases, the resulting tail current will have strong temperature and process variation, which affect the frequency divider's frequency range and functionality. As described in some embodiments herein, in contrast, an AC (Alternating Current) coupling may be used between the tail transistors and the input buffers. In further embodiments, the DC current provided to each tail transistor is set by a reference source, for example a current mirror. As a result, the quiescent current has less variation and the locking characteristics are more stable. In some embodiments, the center frequency of the divider can be controlled by programming the bias current from the reference source. In some embodiments the phase shift between the input local oscillator signal and the output frequency divider is reduced by more than half.

In some embodiments, the reference current source is a variable reference current. As an example, a separate current mirror with a variable current reference may be used for each tail transistor. The current applied to each tail transistor biases each tail transistor independently. This allows for a calibration by separately biasing the I-latch and Q-latch of the frequency divider. This may be used instead of or in addition to a digital correction to correct for RSB (Residual Side Band) signals.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM (Original Equipment Manufacturer) devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antenna, radio frequency (RF) chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes, and constitution.

The various concepts presented throughout this disclosure may be implemented across a broad variety of telecommunication systems, network architectures, and communication standards. Referring now to FIG. 1, as an illustrative example without limitation, a schematic illustration of a radio access network (RAN) 100 is provided. The RAN 100 may implement any suitable wireless communication technology or technologies to provide radio access. As one example, the RAN 100 may operate according to 3' Generation Partnership Project (3GPP) New Radio (NR) specifications, often referred to as 5G. As another example, the RAN 100 may operate under a hybrid of 5G NR and Evolved Universal Terrestrial Radio Access Network (eU-TRAN) standards, often referred to as Long Term Evolution (LTE). The 3GPP refers to this hybrid RAN as a next-generation RAN, or NG-RAN. Of course, many other examples may be utilized within the scope of the present disclosure.

The geographic region covered by the radio access network 100 may be divided into a number of cellular regions (cells) that can be uniquely identified by a user equipment (UE) based on an identification broadcasted over a geographical area from one access point or base station. FIG. 1 illustrates macrocells 102, 104, and 106, and a small cell 108, each of which may include one or more sectors (not shown). A sector is a sub-area of a cell. All sectors within one cell are served by the same base station. A radio link within a sector can be identified by a single logical identification belonging to that sector. In a cell that is divided into sectors, the multiple sectors within a cell can be formed by groups of antennas with each antenna responsible for communication with UEs in a portion of the cell.

In general, a respective base station (BS) serves each cell. Broadly, a base station is a network element in a radio access network responsible for radio transmission and reception in one or more cells to or from a UE. A BS may also be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), a gNode B (gNB) or some other suitable terminology.

In FIG. 1, a first base station 110 is shown in a first cell 102. A second base station 112 is shown in a second cell 104; and a third base station 114 is shown controlling a remote radio head (RRH) 116 in a third cell 106. That is, a base station can have an integrated antenna or can be connected to an antenna or RRH by feeder cables. In the illustrated example, the cells 102, 104, and 106 may be referred to as macrocells, as the base stations 110, 112, and 114 support cells having a large size. Further, a base station 118 is shown in the small cell 108 (e.g., a microcell, picocell, femtocell, home base station, home Node B, home eNode B, etc.) which may overlap with one or more macrocells. The base stations 110, 112, 114, 118 provide wireless access points to a core network for any number of mobile apparatuses.

FIG. 1 further includes a quadcopter or drone, which may be configured to function as a mobile base station 120. That is, in some examples, a cell may not necessarily be stationary, and the geographic area of the cell may move according to the location of a mobile base station 120 such as the quadcopter.

Within the present document, a "mobile" apparatus need not necessarily have a capability to move, and may be stationary. The term mobile apparatus or mobile device broadly refers to a diverse array of devices and technologies. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of things" (IoT). A mobile apparatus may additionally be an automotive or other transportation vehicle, a remote sensor or actuator, a robot or robotics device, a satellite radio, a global positioning system (GPS) device, an object tracking device, a drone, a multi-copter, a quadcopter, a remote control device, a consumer and/or wearable device, such as eyewear, a wearable camera, a virtual reality device, a smart watch, a health or fitness tracker, a digital audio player (e.g., MP3 player), a camera, a game console, etc. A mobile apparatus may additionally be a digital home or smart home device such as a home audio, video, and/or multimedia device, an appliance, a vending machine, intelligent lighting, a home security system, a smart meter, etc. A mobile apparatus may additionally be a smart energy device, a security device, a solar panel or solar array, a municipal infrastructure device controlling electric power (e.g., a smart grid), lighting, water, etc.; an industrial automation and enterprise device; a logistics controller; agricultural equipment; military defense equipment, vehicles, aircraft, ships, and weaponry, etc. Still further, a mobile apparatus may provide for connected medicine or telemedicine support, i.e., health care at a distance. Telehealth devices may include telehealth monitoring devices and telehealth administration devices, whose communication may be given preferential treatment or prioritized access over other types of information, e.g., in terms of prioritized access for transport of critical service data, and/or relevant QoS for transport of critical service data.

Within the RAN 100, the cells may include UEs that may be in communication with one or more sectors of each cell. For example, UEs 122 and 124 may be in communication with base station 110; UEs 126 and 128 may be in communication with base station 112; UEs 130 and 132 may be in communication with base station 114 by way of RRH 116; UE 134 may be in communication with base station 118; and UE 136 may be in communication with mobile base station 120. Here, each base station 110, 112, 114, 118, and 120 may be configured to provide an access point to a core network (not shown) for all the UEs in the respective cells.

In another example, a mobile network node (e.g., mobile base station 120 in the form of the quadcopter) may instead be configured to function as a UE. For example, the quadcopter may operate within cell 102 by communicating with base station 110. In some aspects of the present disclosure, two or more UE (e.g., UEs 126 and 128) may communicate with each other using peer to peer (P2P) or sidelink signals 127 without relaying that communication through a base station (e.g., base station 112).

Wireless communication between a RAN 100 and a UE (e.g., UE 122 or 124) may be described as utilizing an air interface. Transmissions over the air interface from a base station (e.g., base station 110) to one or more UEs (e.g., UE 122 and 124) may be referred to as downlink (DL) transmission. In accordance with certain aspects of the present disclosure, the term downlink may refer to a point-to-multipoint transmission originating at a scheduling entity (described further below; e.g., base station 110). Another way to describe this scheme may be to use the term broadcast channel multiplexing. Transmissions from a UE (e.g., UE 122) to a base station (e.g., base station 110) may be referred to as uplink (UL) transmissions. In accordance with further aspects of the present disclosure, the term uplink may refer to a point-to-point transmission originating at a scheduled entity (described further below; e.g., UE 122).

For example, DL transmissions may include unicast or broadcast transmissions of control information and/or traffic information (e.g., user data traffic) from a base station (e.g., base station 110) to one or more UEs (e.g., UEs 122 and 124), while UL transmissions may include transmissions of control information and/or traffic information originating at a UE (e.g., UE 122). In addition, the uplink and/or downlink control information and/or traffic information may be time-divided into frames, subframes, slots, and/or symbols. As used herein, a symbol may refer to a unit of time that, in an orthogonal frequency division multiplexed (OFDM) waveform, carries one resource element (RE) per sub-carrier. A slot may carry 7 or 14 OFDM symbols. A subframe may refer to a duration of 1 ms. Multiple subframes or slots may be grouped together to form a single frame or radio frame. Of course, these definitions are not required, and any suitable scheme for organizing waveforms may be utilized, and various time divisions of the waveform may have any suitable duration.

In some examples, access to the air interface may be scheduled, wherein a scheduling entity (e.g., a base station) allocates resources (e.g., time-frequency resources) for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, UEs or scheduled entities utilize resources allocated by the scheduling entity.

Base stations are not the only entities that may function as a scheduling entity. That is, in some examples, a UE may function as a scheduling entity, scheduling resources for one or more scheduled entities (e.g., one or more other UEs). In other examples, sidelink signals may be used between UEs without necessarily relying on scheduling or control information from a base station. For example, UE 138 is illustrated communicating with UEs 140 and 142. In some examples, the UE 138 is functioning as a scheduling entity or a primary sidelink device, and UEs 140 and 142 may function as a scheduled entity or a non-primary (e.g., secondary) sidelink device. In still another example, a UE may function as a scheduling entity in a device-to-device (D2D), peer-to-peer (P2P), or vehicle-to-vehicle (V2V) network, and/or in a mesh network. In a mesh network example, UEs 140 and 142 may optionally communicate directly with one another in addition to communicating with the scheduling entity 138.

Figure 2:
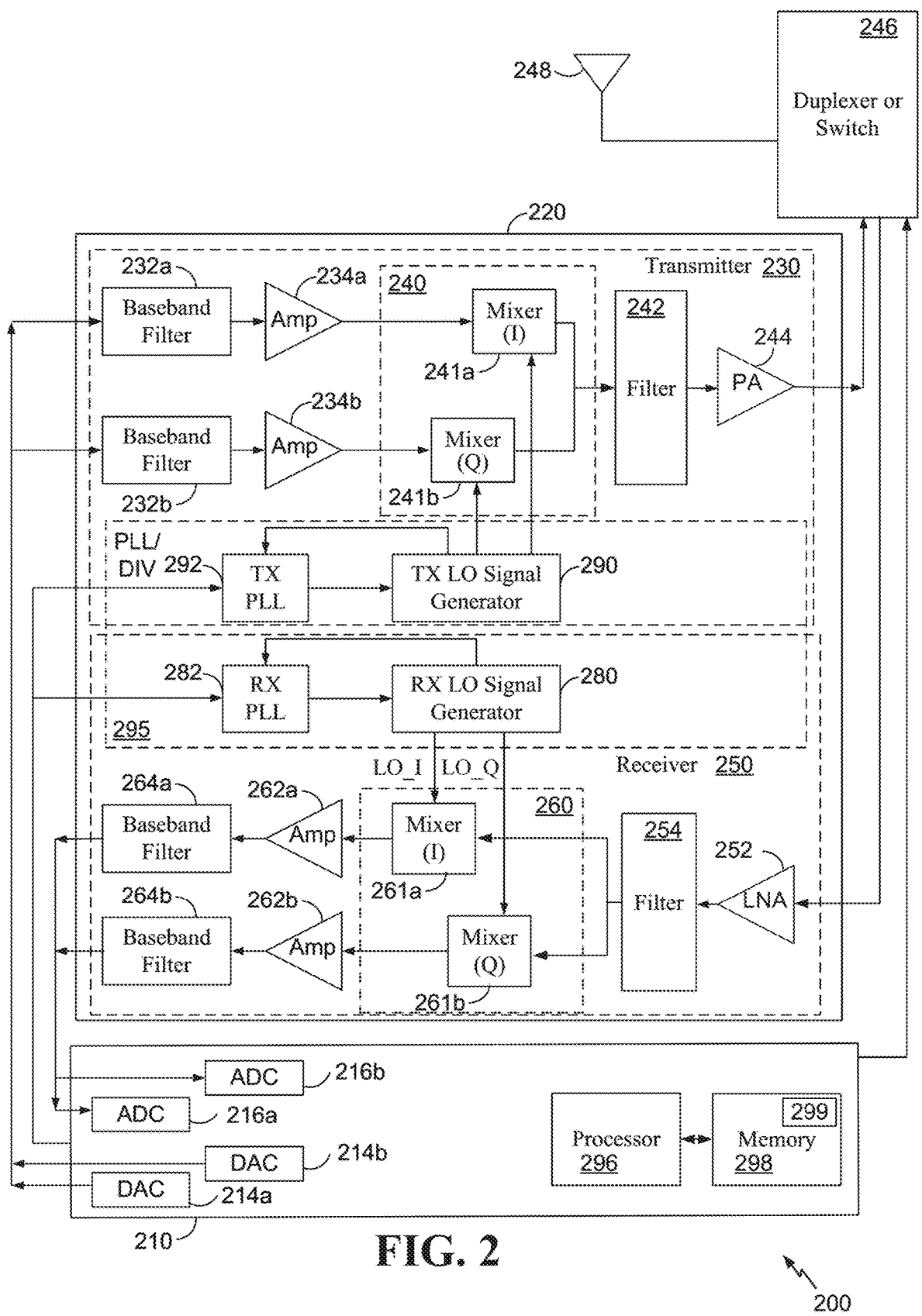
FIG. 2 illustrates a block diagram showing a wireless device in accordance with another aspect of the disclosure.

FIG. 2 is a block diagram showing a wireless device 200 in which the exemplary techniques of the present disclosure may be implemented. The wireless device 200 may, for example, be an embodiment of any of the wireless devices illustrated in FIG. 1. FIG. 2 shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, the wireless device 200 generally comprises the transceiver 220 and a data processor 210. The data processor 210 may include a processor 296 operatively coupled to a memory 298. The memory 298 may be configured to store data and program codes shown generally using reference numeral 299, and may generally comprise analog and/or digital processing components. The transceiver 220 includes a transmitter 230 and a receiver 250 that support bi-directional communication. In general, the wireless device 200 may include any number of transmitters and/or receivers for any number of communication systems and frequency bands. All or a portion of the transceiver 220 may be implemented on one or more analog integrated circuits (ICs), radio frequency ICs (RFICs), mixed-signal ICs, etc.

In the transmit path, the data processor 210 processes data to be transmitted and provides in-phase (I) and quadrature (Q) analog output signals to the transmitter 230. In some embodiments, the data processor 210 includes a first digital-to-analog-converter (DAC) 214*a* and a second DAC 214*b* for converting digital signals generated by the data processor 210 into the I and Q analog output signals, e.g., I and Q output currents, for further processing. In other embodiments, the first DAC 214*a* and the second DAC 214*b* are included in the transceiver 220 and the data processor 210 provides data (e.g., for I and Q) to the transceiver 220 digitally.

Within the transmitter 230, lowpass filters 232*a* and 232*b* filter the I and Q analog transmit signals, respectively, to remove undesired images caused by the prior digital-to-analog conversion. Amplifiers (Amp) 234*a* and 234*b* amplify the signals from lowpass filters 232*a* and 232*b*, respectively, and provide I and Q baseband signals. An upconverter 240 having upconversion mixers 241*a* and 241*b* upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal is routed through a duplexer 246 or switch and transmitted via an antenna 248. While examples discussed herein utilize I and Q signals, those of skill in the art will understand that components of the transceiver may be configured to utilize polar modulation.

In the receive path, the antenna 248 receives communication signals and provides a received RF signal, which is routed through a duplexer 246 or switch and provided to a low noise amplifier (LNA) 252. The duplexer 246 is designed to operate with a specific receive-to-transmit duplexer frequency separation, such that the receive (RX) signals are isolated from the transmit (TX) signals. The RX RF signal is amplified by the LNA 252 and filtered by a filter 254 to obtain a desired RF input signal. Downconversion mixers 261*a* and 261*b* in a downconverter 260 mix the output of filter 254 with I and Q RX LO signals (i.e., LO_I and LO_Q) from an RX LO signal generator 280 to generate I and Q baseband signals. The I and Q baseband signals are amplified by amplifiers 262*a* and 262*b* and further filtered by lowpass filters 264*a* and 264*b* to obtain I and Q analog input signals, which are provided to the data processor 210. In the exemplary embodiment shown, the data processor 210 includes analog-to-digital-converters (ADC's) 216*a* and 216*b* for converting the analog input signals into digital signals to be further processed by the data processor 210. In some embodiments, the ADCs 216*a* and 216*b* are included in the transceiver 220 and provide data to the data processor 210 digitally.

In FIG. 2, the TX LO signal generator 290 generates the I and Q TX LO signals used for frequency upconversion, while the RX LO signal generator 280 generates the I and Q RX LO signals used for frequency downconversion. Each LO signal is a periodic signal with a particular fundamental frequency. A phase locked loop (PLL) 292 receives timing information from the data processor 210 and generates a control signal used to adjust the frequency and/or phase of the TX LO signals from LO signal generator 290. Similarly, a RX PLL 282 receives timing information from the data processor 210 and generates a control signal used to adjust the frequency and/or phase of the RX LO signals from RX LO signal generator 280.

In some embodiments, the RX PLL 282, the TX PLL 292, the RX LO signal generator 280, and the TX LO signal generator 290 may alternatively be combined into a single LO generator circuit 295, which may include common or shared LO signal generator circuitry to provide the TX LO signals and the RX LO signals. Alternatively, separate LO generator circuits may be used to generate the TX LO signals and the RX LO signals.

Certain components of the transceiver 220 are functionally illustrated in FIG. 2, and the configuration illustrated therein may or may not be representative of a physical device configuration in certain implementations. For example, as described above, the transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules, chips, and/or components. For example, the power amplifier 244, the filter 242, and the duplexer 246 may be implemented in separate modules or as discrete components, while the remaining components illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide good linearity, efficiency, or a combination of good linearity and efficiency.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2, the transmitter 230 and the receiver 250 are implemented with the direct-conversion architecture.

In some embodiments in a super-heterodyne architecture, the filter 242, PA 244, LNA 252 and filter 254 may be implemented separately from other components in the transmitter 230 and receiver 250, and may be implemented on a millimeter wave integrated circuit. An example super-heterodyne architecture is illustrated in FIG. 3.

Figure 3:
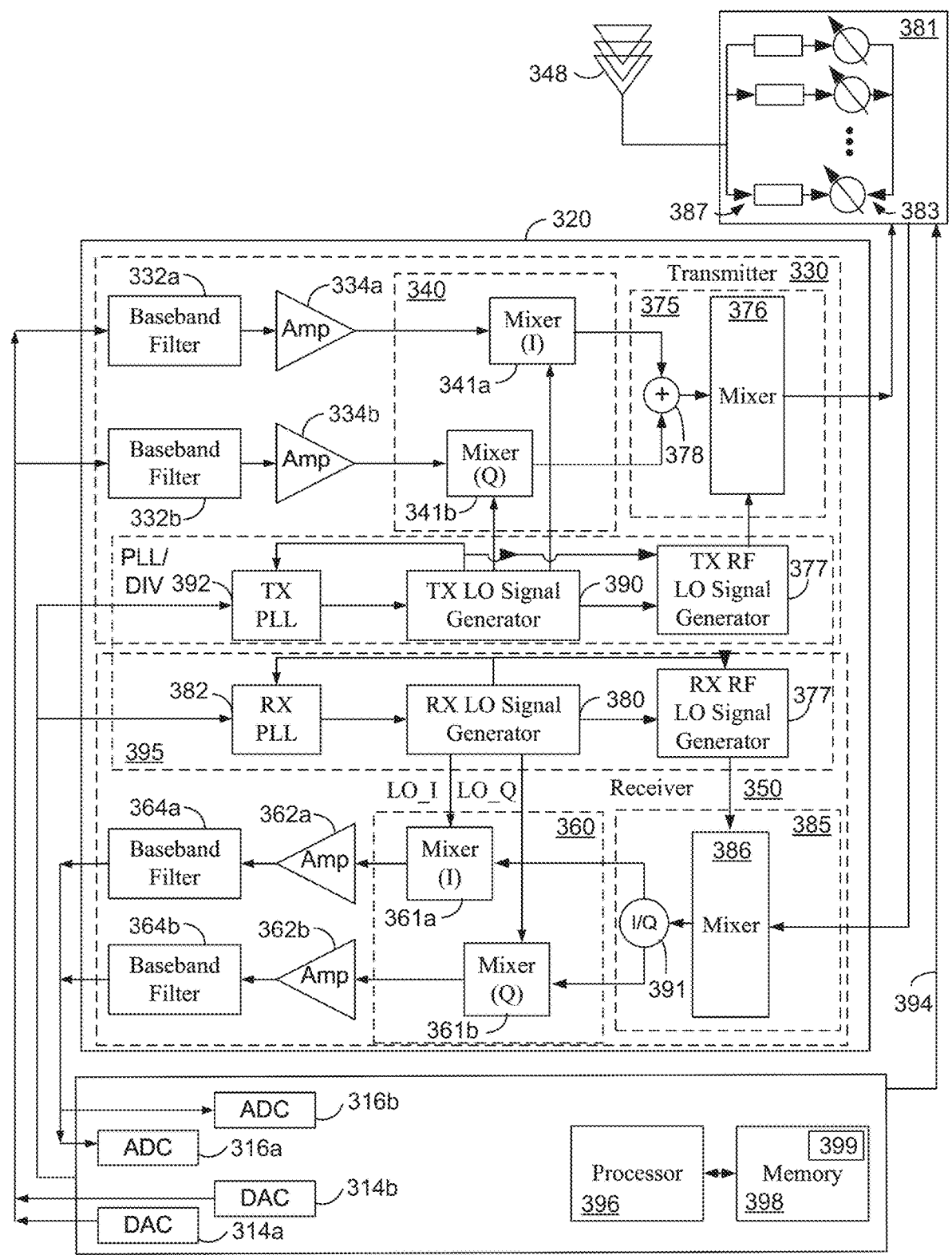
FIG. 3 illustrates a block diagram of an alternative wireless device in accordance with another aspect of the disclosure.

FIG. 3 is a block diagram showing a wireless device in which the exemplary techniques of the present disclosure may be implemented. Certain components, of the wireless device 300 in FIG. 3 may be configured similarly to those in the wireless device 200a shown in FIG. 2. The wireless device 300 generally comprises the transceiver 320 and a data processor 310. The data processor 310 may include a processor 396 operatively coupled to a memory 398. The memory 398 may be configured to store data and program codes shown generally using reference numeral 399, and may generally comprise analog and/or digital processing components. The transceiver 320 includes a transmitter 330 and a receiver 350 that support bi-directional communication.

In the transmit path, the data processor 310 processes data to be transmitted, converts the digital signals generated by the data processor 310 into the I and Q analog output signals through digital-to-analog-converters (DAC's) 314$a$ and 314$b$. The transmitter 330 receives the I and Q analog transmit signals, lowpass filters 332$a$ and 332$b$ filter the I and Q analog transmit signals, and amplifiers 334$a$ and 334$b$ amplify the signals from lowpass filters 332$a$ and 332$b$, respectively, and provide I and Q baseband signals to mixers 341$a$, 341$b$ for upconversion in an upconverter 340.

The wireless device 300 is an example of a heterodyne (or superheterodyne) architecture in which the upconverter 340 and a downconverter 360 are configured to process a communication signal between baseband and an intermediate frequency (IF). For example, the upconverter 340 may be configured to provide an IF signal to an upconverter 375. In some embodiments, the upconverter 375 may comprise a summing function 378 and upconversion mixer 376. The summing function 378 combines the I and the Q outputs of the upconverter 340 and provides a non-quadrature signal to the upconversion mixer 376. The non-quadrature signal may be single ended or differential. The upconversion mixer 376 is configured to receive the IF signal from the upconverter 340 and TX RF LO signals from a TX RF LO signal generator 377, and provide an upconverted RF signal to phase shift circuitry 381. While PLL 392 is illustrated in FIG. 3 as being shared by the TX LO signal generator 390 and TX RF LO signal generator 377, a respective PLL for each signal generator may be implemented.

In some embodiments, components in the phase shift circuitry 381 may comprise one or more adjustable or variable phased array elements, and may receive one or more control signals from the data processor 310 over the connection 394 and operate the adjustable or variable phased array elements based on the received control signals. In some embodiments, the phase shift circuitry 381 comprises phase shifters 383 and phased array elements 387. Although three phase shifters 383 and three phased array elements 387 are shown for ease of illustration, the phase shift circuitry 381 may comprise more or fewer of the phase shifters 383 and the phased array elements 387.

Each of the phase shifters 383 may be configured to receive the RF transmit signal from the upconverter 375, alter the phase by an amount, and provide the RF signal to a respective one of the phased array elements 387. Each of the phased array elements 387 may comprise transmit and receive circuitry including one or more filters, amplifiers, driver amplifiers, and power amplifiers. In some embodiments, the phase shifters 383 may be incorporated within respective phased array elements 387.

The output of the phase shift circuitry 381 is provided to an antenna array 348. In some embodiments, the antenna array 348 comprises a number of antennas that correspond to the number of phase shifters 383 and phased array elements 387, for example such that each antenna element is coupled to a respective one of the phased array elements 387. In some embodiments, the phase shift circuitry 381 and the antenna array 348 may be referred to as a phased array.

In a receive direction, an output of the phase shift circuitry 381 is provided to a downconverter 385. In some embodiments, the downconverter 385 may comprise an I/Q generation function 391 and a downconversion mixer 386. In some embodiments, the downconversion mixer 386 downconverts the receive RF signal provided by the phase shift circuitry 381 to an IF signal according to RX RF LO signals provided by an RX RF LO signal generator 379. The I/Q generation function 391 receives the IF signal from the downconversion mixer 386 and generates I and Q signals for the downconverter 360, which downconverts the IF signals to baseband.

Downconversion mixers 361a and 361b in the downconverter 360 mix the output of a filter 354 with I and Q RX LO signals (i.e., LO_I and LO_Q) from an RX LO signal generator 380 to generate I and Q baseband signals. The I and Q baseband signals are amplified by amplifiers 362a and 362b and further filtered by lowpass filters 364a and 364b to obtain I and Q analog input signals, which are provided to the data processor 310. In the exemplary embodiment shown, the data processor 310 includes analog-to-digital-converters (ADC's) 316a and 316b for converting the analog input signals into digital signals to be further processed by the data processor 310. While the RX PLL 382 is illustrated in FIG. 3 as being shared by the RX LO signal generator 380 and RX RF LO signal generator 379, a respective PLL for each signal generator may be implemented.

In some embodiments, the upconverter 375, downconverter 385, and the phase shift circuitry 381 are implemented on a common integrated circuit (IC). In some embodiments, the summing function 378 and the I/Q generation function 391 are implemented separate from the upconversion mixer 376 and downconversion mixer 386 such that the upconversion mixer 376 the downconversion mixer 386 and the phase shift circuitry 381 are implemented on the common IC, but the summing function 378 and I/Q generation function 391 are not (e.g., the summing function 378 and I/Q generation function 391 are implemented in another IC coupled to the IC having the upconversion mixer 376 and downconversion mixer 386). In some embodiments, the TX RF LO signal generator 377 and RX RF LO signal generator 379 are included in the common IC. In some embodiments in which phase shift circuitry is implemented on a common IC with 376, 386, 377, 378, 379, and/or 391, the common IC and the antenna array 348 are included in a module, which may be coupled to other components of the transceiver 320 via a connector. In some embodiments, the phase shift circuitry 381, for example, a chip on which the phase shift circuitry 381 is implemented, is coupled to the antenna array 348 by an interconnect. For example, components of the antenna array 348 may be implemented on a substrate and coupled to an integrated circuit implementing the phase shift circuitry 381 via a flexible printed circuit.

In some embodiments, both the architecture illustrated in FIG. 2 and the architecture illustrated in FIG. 3 are implemented in the same device. For example, a wireless device may be configured to communicate with signals having a frequency below about 10 GHz using the architecture illustrated in FIG. 2 and to communicate with signals having a frequency above about 10 GHz using the architecture illustrated in FIG. 3. In other examples, a wireless device may be configured to communicate with signals having a frequency below about 24 GHz using the architecture illustrated in FIG. 2 and to communicate with signals having a frequency above about 24 GHz using the architecture illustrated in FIG. 3. Other configurations are also possible. In devices in which both architectures are implemented, one or more components of FIGS. 2 and 3 may be shared between the two architectures. For example, both signals that have been downconverted directly to baseband from RF and signals that have been downconverted from RF to baseband via an IF stage may be filtered by the same lowpass filter 264 at baseband. In other embodiments, a first version of the lowpass filter 264 is included in the portion of the device which implements the architecture of FIG. 2 and a second version of the filter 364 is included in the portion of the device which implements the architecture of FIG. 3.

Figure 4:
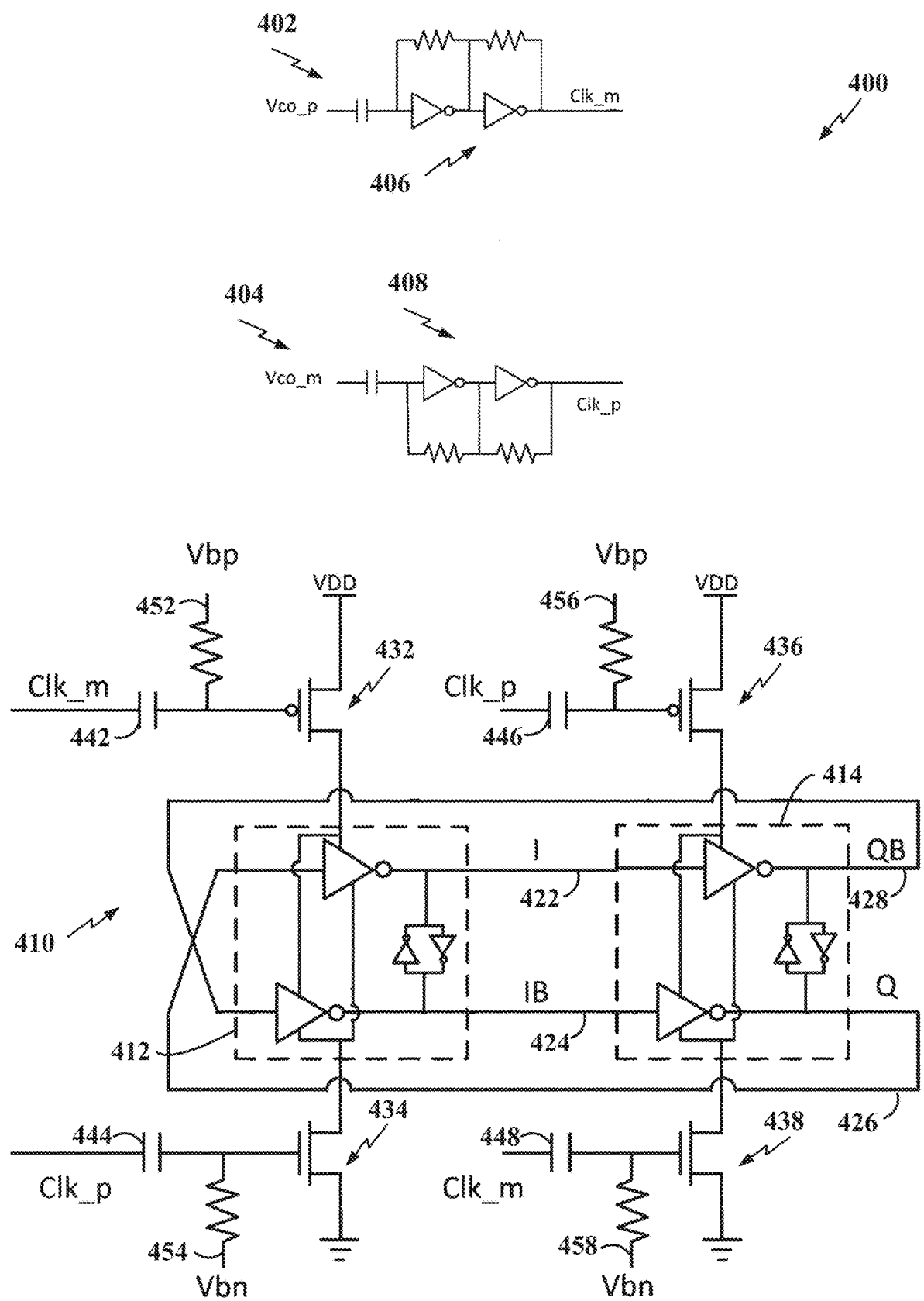
FIG. 4 illustrates a circuit diagram of an example frequency divider in accordance with another aspect of the disclosure.

FIG. 4 is a circuit diagram 400 of a frequency divider 410 and other related components which are suitable for use, for example, in the TX LO signal generator 290 or RX LO signal generator 280 (and/or 390 or 380). This drawing figure is described in the context of a transmitter local oscillator signal generator but may be adapted also for a receiver local oscillator signal generator. This circuit is implemented as a divide by 2 frequency divider but more frequency dividers may be added in series with the illustrated frequency divider to produce more divisions and more outputs. An upper branch 402 has a p input which may be coupled to a voltage controlled oscillator (VCO) output and a lower branch 404 has a complementary m input, which may be coupled to another output of the VCO. These inputs may be outputs of a stable oscillator such as the TX PLL 292 (or 392, 282, 382, etc.) The upper branch input may be applied to a first input buffer, the upper input buffer 406, which operates as a pre-divider buffer. The upper input buffer includes a series capacitor coupled to a sequence of two series inverters. Parallel resistance in the form of a feedback resistor is connected across a series inverter. A first feedback resistor is coupled across the first series inverter and a second feedback resistor is coupled across the second series inverter. More or fewer inverters may be used. The illustrated input buffer is provided only as an example, any other suitable buffer circuit may be used or the buffer may be omitted. The output of the upper input buffer 406 is an m clock. Similarly the lower branch input may be applied to a second input buffer, the lower input buffer 408 with a similar or the same design to produce a p clock output that is complementary to the m clock output.

The frequency divider 410 has an I branch 412 and a Q branch 414. The I branch generates differential divided I signals at an I node 422 and an IB node 424. The Q branch generates differential divided Q signals at a Q node 426 and a QB node 428. Each frequency divider is voltage biased with respective tail transistors. The I branch 412 is voltage biased to a supply voltage by a first transistor 432 at one side coupled to the supply voltage, e.g. $V_{DD}$, and a second transistor 434 on the opposite side that is coupled to ground, e.g. $V_{SS}$. The first transistor 432 is an I branch supply transistor. The second transistor 434 is an I branch ground transistor. Similarly, the Q branch is biased by a third transistor 436 coupled to the supply voltage and a fourth transistor 438. The third transistor 436 is a Q branch supply transistor and the fourth transistor 438 is a Q branch ground transistor. The I branch 412 first transistor 432 is gated by the m clock signal from the upper input buffer 406 as is the Q branch 414 fourth transistor 438. The Q branch 414 third transistor 436 is gated by the p clock of the lower input buffer 408 as is the I branch 412 second transistor 434. The gates control the action of the latches of the frequency divider 410.

Alternatively, instead of an I branch 412 and a Q branch 414, the frequency divider 410 may be considered as having a first I/Q section and a complementary second I/Q section with IB/QB outputs. The first I/Q section has the first transistor 432 as an I frequency input and the fourth transistor 438 as a complementary Q frequency input. The second I/Q section has the second transistor 434 as an IB frequency input and the third transistor 436 as a QB frequency input. In other words, the first I/Q section is coupled to the first frequency input in an I portion and to the fourth frequency input in a Q portion to generate the first I/Q divided frequency output. The complementary second I/Q section is coupled to the second frequency input in an I portion and the third frequency input in a Q portion to generate the complementary IB/QB output.

The Direct Current (DC) voltages of the transistors that bias the latches of the divider are set with the respective bias voltage sources 452, 454, 456, 458. In the illustrated example, the latches are inverters. The first transistor 432 drain is coupled to a bias current port of an inverter in an I portion of the frequency divider. Each of the transistors 432, 434, 436, 438 are each coupled to a respective bias current port of a respective inverter of the frequency divider. However, other frequency divider configurations may be used to suit different applications. These are the tail transistors of the circuit. The corresponding current may have strong variations between different buffers and with changes in operating temperature. These temperature variations may affect the frequency and other performance parameters of the frequency divider 410. The frequency divider has four frequency inputs, which may each be supplied by an oscillator as the p VCO and m VCO signals through the upper input buffer 406 and the lower input buffer 408. The input buffers produce a respective p clock signal and an m clock signal, respectively, that are each coupled to a gate of a respective tail transistor. The tail transistor gates provide the frequency inputs to the frequency divider.

In the illustrated example, a first frequency input at the first transistor 432 and a fourth frequency input at the fourth transistor 438 are coupled to a first oscillator frequency output, the p VCO signal, through an upper input buffer 406. A complementary second frequency input at a gate of the second transistor 434 and a third frequency input at a gate of the third transistor 436 are coupled to a second oscillator frequency output, the m VCO signal, through a lower input buffer 408. These are all applied to the frequency divider to generate a first in-phase/quadrature (I/Q) divided frequency output with an I node 422 and a Q node 426, and a complementary second I/Q divided frequency output with an IB node 424 and a QB node 428.

As shown, AC (Alternating Current) coupling capacitors are placed as a coupling capacitance between each input buffer and connected tail transistor gate. However, in some embodiments not all tail transistors are coupled through a capacitor. In other embodiments, additional components are added to augment the AC coupling function of the capacitor. In some embodiments, the capacitance is provided by a different component instead of, or in addition to, a capacitor. In particular, the first AC coupling capacitor 442 is coupled between the upper input buffer 406 and the first frequency input of first transistor 432. The second AC coupling capacitor 444 is placed between the lower input buffer 408 and the second frequency input of the second transistor 434. The second transistor 434 is a complementary type, e.g. n-type, compared to the first tail transistor, e.g. p-type. A third AC coupling capacitor 446 is coupled between the lower input buffer 408 and the third frequency input of the third transistor 436. The fourth AC coupling capacitor 448 is placed between the upper input buffer 406 and the fourth frequency input of the fourth transistor 438. The fourth transistor 438 is a complementary type, e.g. n-type, compared to the first (432) and the third (436) transistors, e.g. p-type. The capacitors are coupled in series for AC coupling between the respective input buffer and frequency input.

While the AC component is passed through the AC coupling capacitors to the frequency inputs, the DC component (which may vary with manufacturing variation and operation conditions, as described above) may be removed by the AC coupling capacitors. A bias voltage source may instead be coupled to each frequency input between the respective coupling capacitor and frequency input. The bias voltage source may be coupled through a series resistance and may be independently controllable. The frequency inputs of the p-type transistors, the first transistor 432 and third transistor 436, are biased through optional series resistors, such as a first series resistance and a third series resistance, by a respective bias voltage source 452, 456. The voltage level is identified as Vbp. Similarly, the frequency inputs of the second transistor 434 and the fourth transistor 438 are biased through optional series resistors, such as a second series resistance and a fourth series resistance, by a respective bias voltage source 454, 458. The bias voltage for the n-type transistors is identified as Vbn. The two Vbp sources may be set to the same or different voltages and the two Vbn sources may also be set to the same or different voltages.

Figure 5:
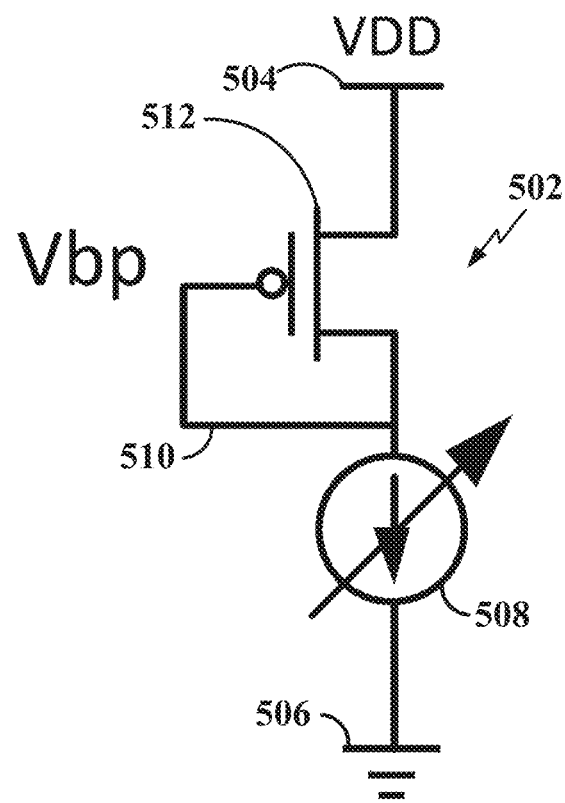
FIG. 5 illustrates a circuit diagram of an example bias voltage source in accordance with another aspect of the disclosure.

FIG. 5 is a circuit diagram of a suitable bias voltage source for each bias voltage source 452, 456 in the form of a Vbp current mirror. As shown a p-type transistor 502 is coupled to the supply voltage 504, e.g. $V_{DD}$, at a source and to ground 506 at the drain. The drain has a feedback loop 510 to the gate 512. The current through the drain to ground is controlled by a variable reference current source 508. Alternatively, the current source is set to a desired reference current and not varied or variable. The structure of the current mirror locks the current mirror to a constant current value at a node between the gate and the drain. This node is coupled to the respective tail transistors for consistent behavior across different operating conditions. The current mirror (or another bias) also improves the operation of the frequency divider across different frequencies. The variable reference current source allows for regulating the first bias voltage and each bias voltage source to be independently regulated and regulatable at each input.

Figure 6:
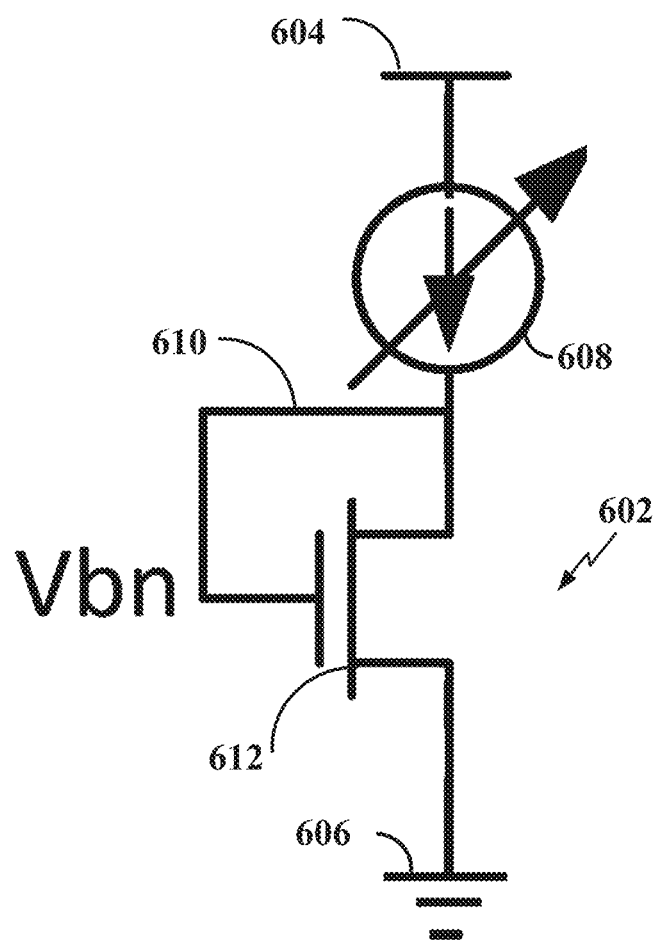
FIG. 6 illustrates a circuit diagram of an example alternative bias voltage source in accordance with another aspect of the disclosure.

FIG. 6 is a circuit diagram of a suitable bias voltage source for each bias voltage source 454, 458 in the form of a Vbn current mirror. As shown, an n-type transistor 602 is coupled across a supply voltage 604 and ground 606, e.g. $V_{SS}$. The drain has a feedback loop 610 to the gate 612. The current through the drain is controlled by a variable reference current source 608 similar to that of the Vbp source. The node at the gate is coupled to the respective tail transistors for consistent behavior across different operating conditions. The current mirrors shown here are provided as examples. Any other suitable controllable current and/or bias voltage source may be used to suit a particular implementation. The current mirror (or another bias) also improves the operation of the frequency divider across different frequencies. The current mirrors (or another bias) also reduce variations in the quiescent current. In addition, the center frequency of the divider I/Q and IB/QB outputs can be adjusted by changing the current of the current mirrors. The bias voltage of each of the four tail transistors can be regulatable independently of each other bias voltage to calibrate the system or maintain stability. In some embodiments, each I/Q divided frequency output is measured and each bias voltage source is regulated independently in response to the corresponding output.

Figure 7:
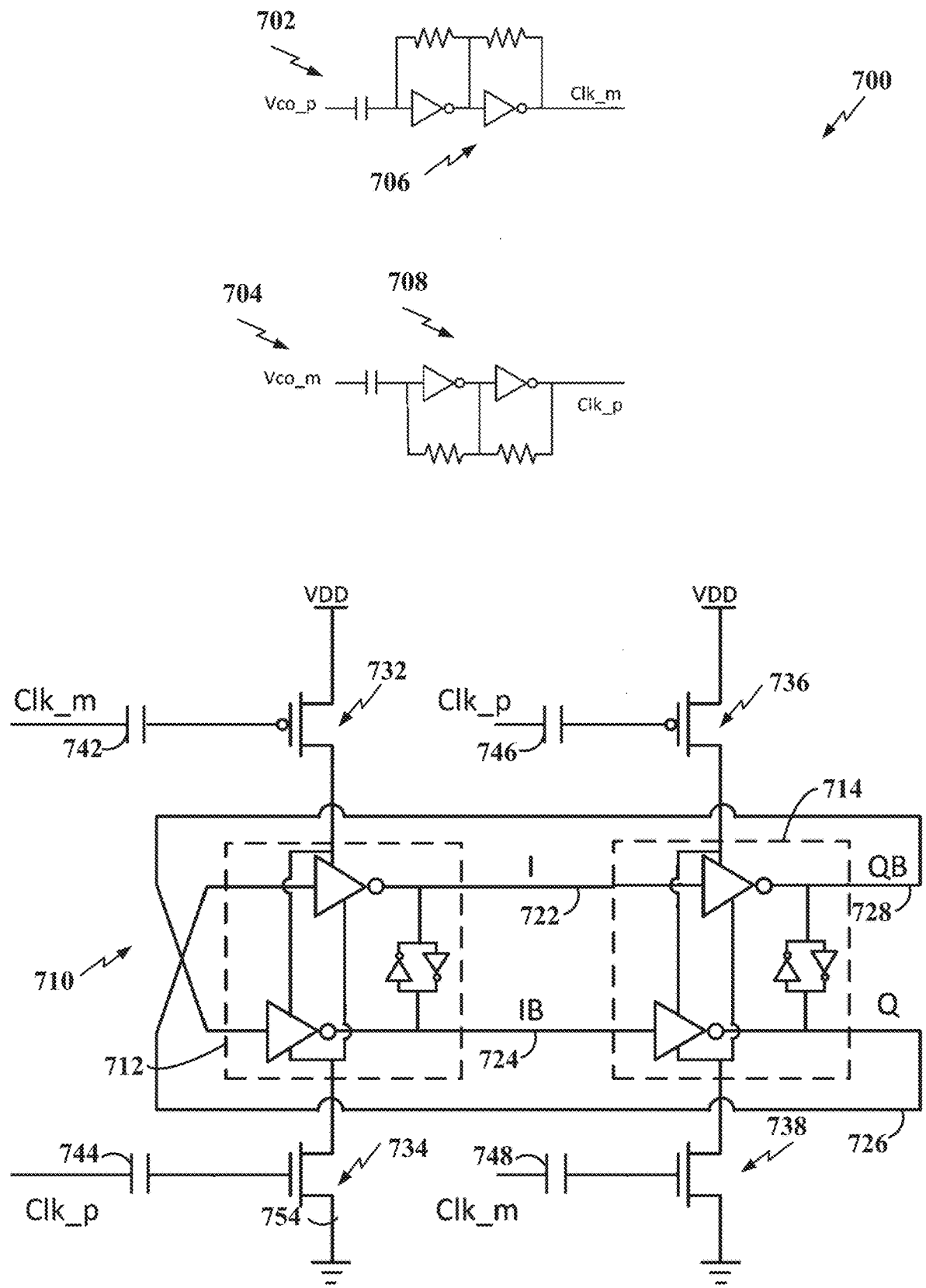
FIG. 7 illustrates a circuit diagram of another example frequency divider in accordance with another aspect of the disclosure.

FIG. 7 is a circuit diagram of an alternative frequency divider 700 suitable for use, for example, in the TX LO signal generator 290 or RX LO signal generator 280 (and/or 390 or 380). This drawing figure is described in the context of a transmitter local oscillator signal generator but may be adapted also for a receiver local oscillator signal generator. The circuit is implemented as a divide by 2 frequency divider but more frequency dividers may be added in series with the illustrated frequency divider to produce more divisions and more outputs.

The frequency divider 710 has an I branch 712 and a Q branch 714. The I branch generates differential divided I signals at an I node 722 and an IB node 724. The Q branch generates differential divided Q signals at a Q node 726 and a QB node. Each frequency divider is voltage biased with respective tail transistors. The I branch 712 is voltage biased to a supply voltage by a first transistor 732, a supply transistor, at one side coupled to the supply voltage, e.g. $V_{DD}$, and a second transistor 734, a ground transistor, on the opposite side that is coupled to ground, e.g. $V_{SS}$. Similarly, the Q branch is biased by a third transistor 736 coupled to the supply voltage and a fourth transistor 738.

The first transistor 732, on the supply side of the I branch 712, receives an m clock signal through an upper branch input buffer 706 at the gate of the first transistor 732. The fourth transistor 738, on the ground side of the Q branch 714, also receives the m clock signal through the upper branch input buffer 706 at its gate. The third transistor 736, on the supply side of the Q branch 714, receives a p clock through a lower branch input buffer 708 at its gate. The second transistor 734, on the ground side of the I branch 712, also receives the p clock through the lower branch input buffer at its gate. The input buffers are similar to those of FIG. 4 but any other suitable buffer configuration may be used.

AC (Alternating Current) coupling capacitors are placed between each input buffer and the gate of each connected tail transistor. In particular, the first AC coupling capacitor 742 is coupled between the upper branch input buffer 706 and the first frequency input of the first transistor 732. The second AC coupling capacitor 744 is placed between the lower branch input buffer 708 and the second frequency input of the second transistor 734. The second transistor 734 is a complementary type, e.g. n-type, compared to the I branch supply transistor 732, e.g. p-type. A third AC coupling capacitor 746 is coupled between the lower branch input buffer 708 and the third frequency input of the third transistor 736. The fourth AC coupling capacitor 748 is placed between the upper branch input buffer 706 and the fourth frequency input of the fourth transistor 738. The AC coupling capacitors isolate these frequency inputs from DC variations in the local oscillator generator signal. The DC variations can affect the frequency and the current of the divided I/Q frequency output.

Figure 8:
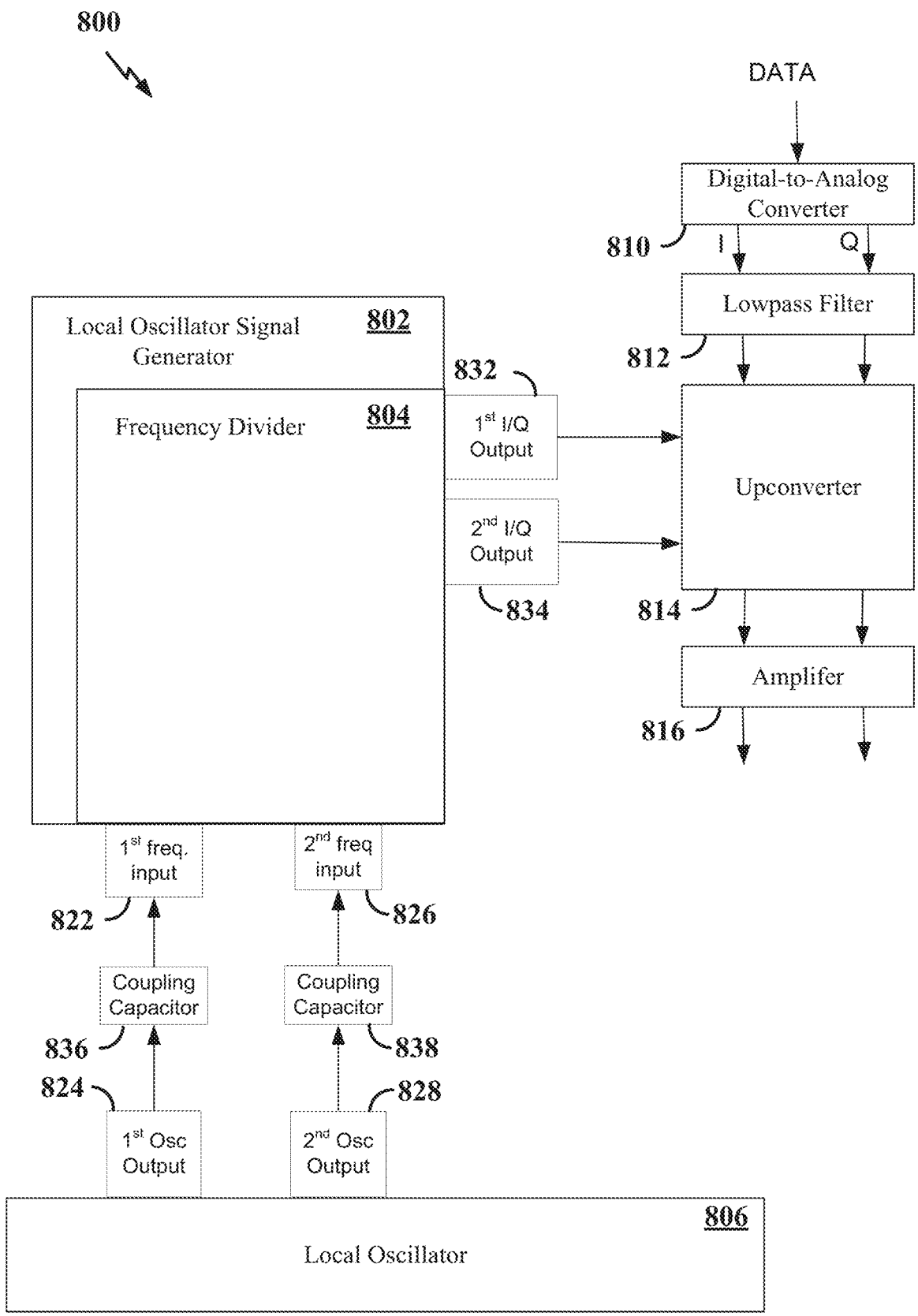
FIG. 8 illustrates a block diagram of a transceiver in accordance with another aspect of the disclosure.

FIG. 8 illustrates a block diagram of a transceiver 800. The transceiver includes a digital to analog converter 810 (e.g. the DAC 214, 314) to convert data to be transmitted into I and Q analog output signals, a lowpass filter 812 (e.g. the filter 232, 332) to remove undesired images from the I and Q output signals, an upconverter 814 (e.g. the upconverter 240, 340) to upconvert the filtered I and Q output signals to an intermediate frequency or a transmit frequency and an amplifier 816 (e.g. the PA 244, and/or an amplifier in the phase shift circuitry 381) to amplify the upconverted I and Q signals to transmit.

The transceiver 800 has a local oscillator signal generator 802 (e.g. 290, 280, 390, 280) coupled to the upconverter 814 to generate I and Q local oscillator signals for the upconverter 814. The local oscillator signal generator 802 has a frequency divider 804 (e.g. the frequency divider 410) with a first frequency input 822 coupled to a first oscillator frequency output 824 and a second frequency input 826 coupled to a complementary second oscillator frequency output 828. The first and second frequency outputs 824, 828 may be complementary and have the same frequency. Thus, the first frequency input 822 and the second frequency input 824 are not intended to represent two frequencies, but rather two components (having the same frequency) of a signal. The frequency divider 804 also has a first in-phase/quadrature (I/Q) divided frequency output 832, and a complementary second I/Q divided frequency output 834. The outputs 832 and 834 may include or be representative of just complementary I components, just complementary Q components, or both complementary I and complementary Q components. A first alternating current (AC) coupling capacitor 836 is coupled between the first frequency input 822 and the first oscillator frequency output 824 and a second AC coupling capacitor 838 is coupled between the second frequency input 826 and the second oscillator frequency output 828.

A local oscillator 806 (e.g., including a VCO and/or a PLL, such as the PLL 292, 282, 392, 382) is configured to generate the first oscillator frequency output 824 and the second oscillator frequency output 828 that are coupled through the first coupling capacitor 836 to the first frequency input 822 and through the second coupling capacitor 838 to the second frequency input 826. The components of the frequency divider 804 are shown in more detail in the representative circuit diagrams of FIGS. 3-7. The context including the local oscillator 806 and the transmit chain are shown in more detail in the block diagrams of FIGS. 2 and 3. In some examples, the frequency dividers 410, 710, and/or 804 operate with an input having a frequency between approximately 14-24 GHz and output (e.g., at the outputs 832, 834) signals having a frequency between approximately 7-12 GHz.

Figure 9:
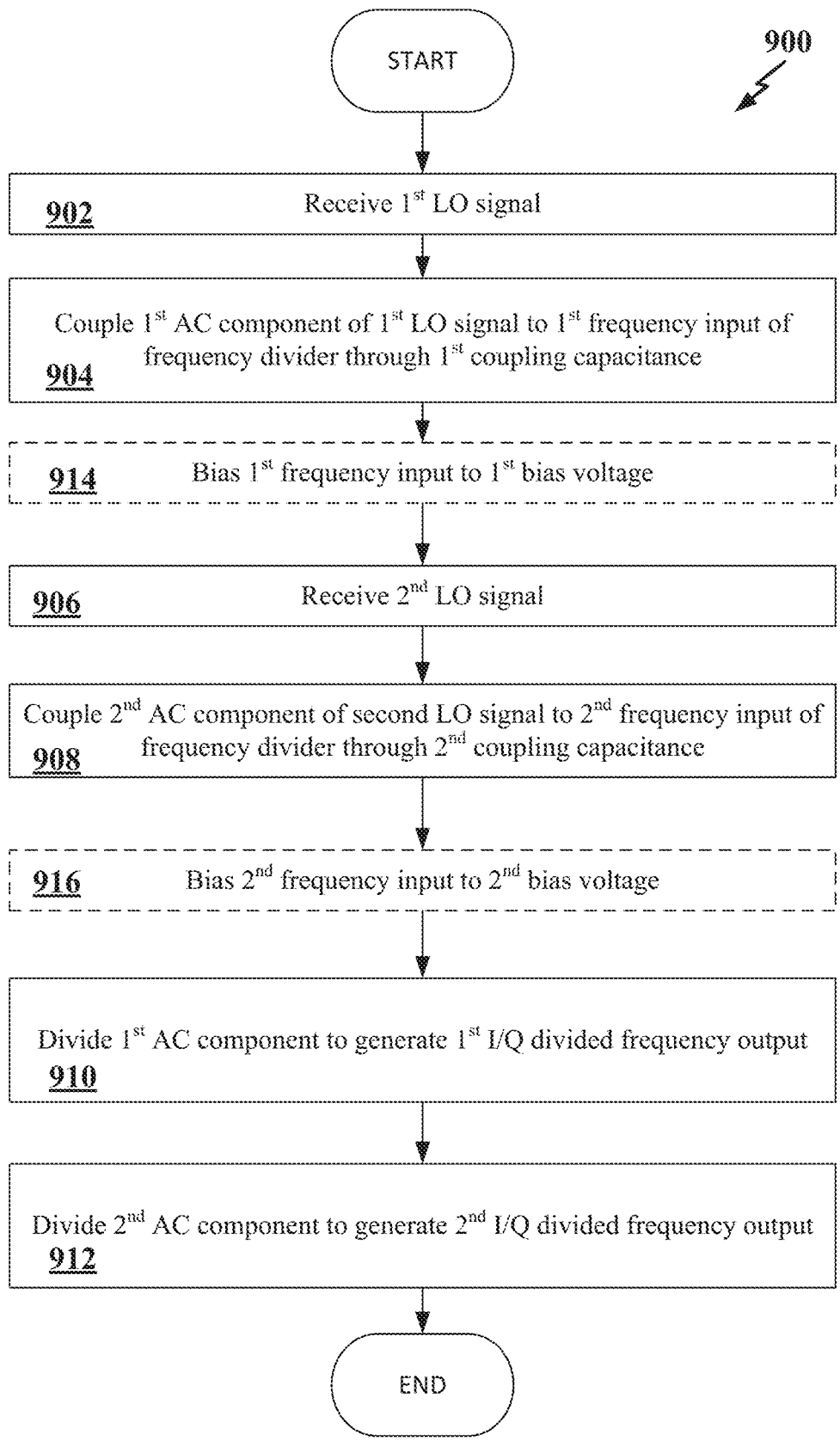
FIG. 9 illustrates a flow diagram of an example method of frequency dividing an input LO signal in accordance with another aspect of the disclosure.

FIG. 9 is a flow chart describing an example of the operation of a method for dividing an oscillator signal. The blocks in the method 900 can be performed in or out of the order shown, and in some embodiments, can be performed at least in part in parallel. In block 902, a first LO signal is received at the frequency divider. In block 904, a first AC component of the first LO signal is coupled to a first frequency input of the frequency divider through a first coupling capacitance. In block 906, a complementary second LO signal is received and in block 908, a second AC component of the second LO signal is coupled to a second frequency input of the frequency divider through a second coupling capacitance.

In block 910, the first AC component is divided by the frequency divider to generate a first I/Q divided frequency output and, in block 912, the second AC component is divided to generate a complementary second I/Q divided frequency output. Blocks 910 and 912 may describe providing just complementary I components, just complementary Q components, or both complementary I and complementary Q components. This output may be used for an upconverter or downconverter within a transceiver. It may also be provided to additional frequency dividers to further divide the original LO signal. While the dividing operations are shown as sequential in block 910 and block 912, in some embodiments a differential circuit is used for the divider and the first I/Q output is generated simultaneously with the complementary second I/Q output. The operations of the method 900 may be performed in different orders than that shown. Some operations may be removed and other operations may be added.

The method optionally includes in block 914, biasing the first frequency input to a first bias voltage between the first coupling capacitance and the first frequency input. In block 916, the method optionally includes biasing the second frequency input to a second independently regulatable bias voltage between the coupling capacitance and the second frequency input. These bias voltages may be provided by the current mirrors as described above. While not illustrated, third and fourth biases may be independently generated and/or provided to the frequency divider, for example to reduce imbalance and/or calibrate/correct for RSB. In other examples, the third and/or fourth biases may be the same as one or both of the first bias voltage and the second bias voltage.

Figure 10:
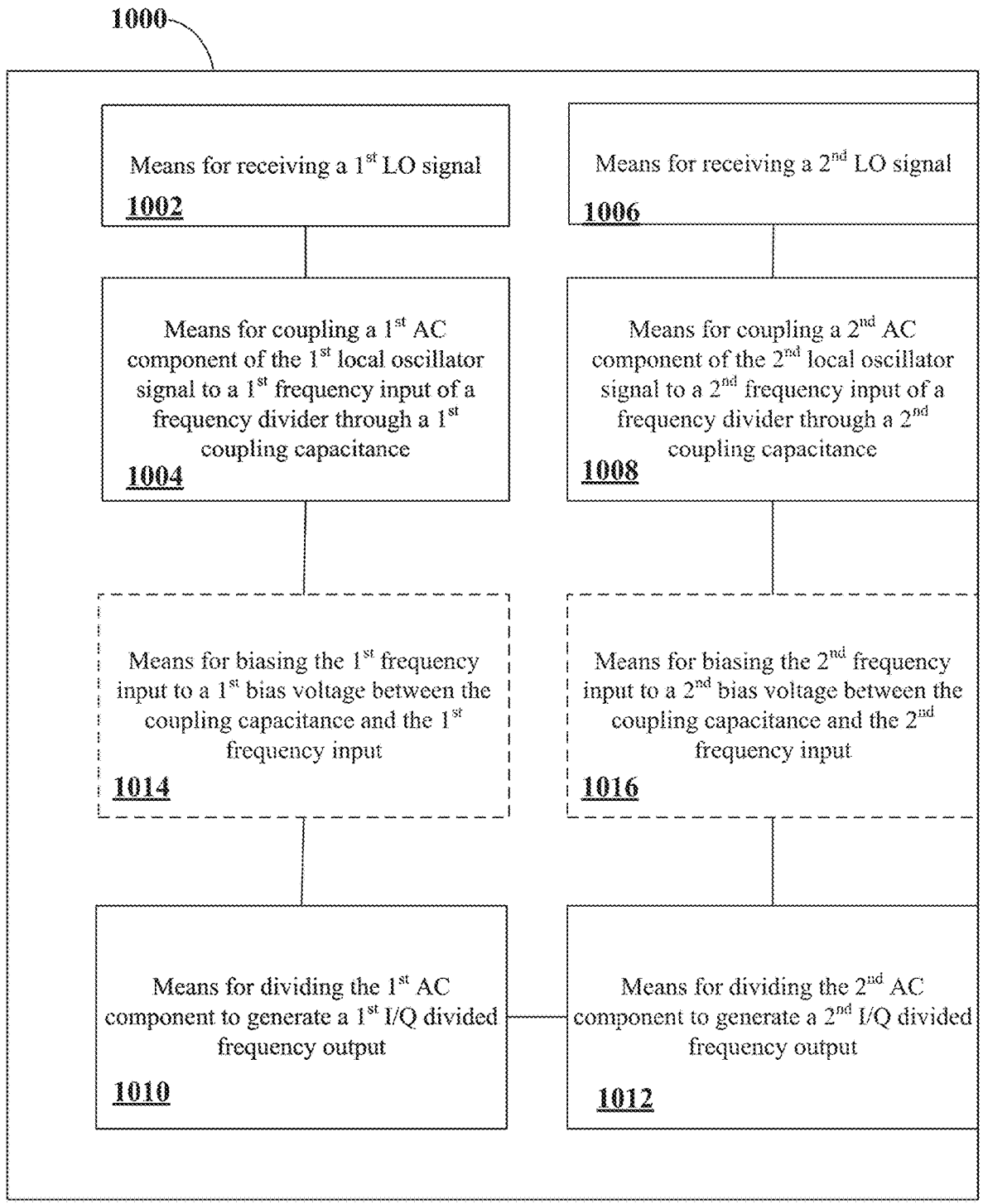
FIG. 10 Illustrates a block diagram of an example wireless communication device in accordance with another aspect of the disclosure.

FIG. 10 is a functional block diagram of an apparatus for dividing an oscillator signal. The apparatus 1000 comprises means 1002 for receiving a first LO signal and means 1004 for coupling a first AC component of the first LO signal to a first frequency input of the apparatus through a first coupling capacitance. The apparatus 1000 further includes means 1006 for receiving a complementary second local oscillator signal and means 1008 for coupling a second AC component of the second local oscillator signal to a second frequency input of the frequency divider through a second coupling capacitance.

A frequency divider portion of the apparatus include means 1010 for dividing the first AC component to generate a first I/Q divided frequency output and means 1012 for dividing the second AC component to generate a complementary second I/Q divided frequency output. The means 1010 for dividing the first AC component may operate simultaneously with the means 1012 for diving the second AC component, just as the other means may all be operating together at the same time to achieve the intended results. The means 1010 and 1012 may be configured to generate just complementary I components, just complementary Q components, or both complementary I and complementary Q components.

The apparatus optionally includes means 914 for biasing the first frequency input to a first bias voltage between the first coupling capacitance and the first frequency input and means 916 for biasing the second frequency input to a second independently regulated bias voltage between the coupling capacitance and the second frequency input. While not illustrated, the apparatus may further include means for (independently) generating and providing third and fourth biases to the frequency divider. These bias voltage means may be implemented by the current mirrors as described above.

The circuit architecture described herein may be implemented on one or more integrated circuits (ICs), analog ICs, radio frequency ICs (RFICs), mixed-signal ICs, application specific integrated circuits (ASICs), printed circuit boards (PCBs), electronic devices, etc. The circuit architecture described herein may also be fabricated with various process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuits described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an application specific integrated circuit (ASIC) such as a mobile station modem (MSM), (v) a module that may be embedded within other devices, (vi) a receiver, cellular phone, wireless device, handset, or mobile unit, (vii) etc.

As used herein, "or" is used intended to be interpreted in the inclusive sense, unless otherwise explicitly indicated. For example, "a or b" may include a only, b only, or a combination of a and b. As used herein, a phrase referring to "at least one of" or "one or more of" a list of items refers to any combination of those items, including single members. For example, "at least one of: a, b, or c" is intended to cover the examples of: a only, b only, c only, a combination of a and b, a combination of a and c, a combination of b and c, and a combination of a and b and c.

The various illustrative components, logic, logical blocks, modules, circuits, operations, and algorithm processes described in connection with the implementations disclosed herein may be implemented as electronic hardware, firmware, software, or combinations of hardware, firmware, or software, including the structures disclosed in this specification and the structural equivalents thereof. The interchangeability of hardware, firmware and software has been described generally, in terms of functionality, and illustrated in the various illustrative components, blocks, modules, circuits and processes described above. Whether such functionality is implemented in hardware, firmware or software depends upon the particular application and design constraints imposed on the overall system.

Various modifications to the implementations described in this disclosure may be readily apparent to persons having ordinary skill in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, various features that are described in this specification in the context of separate implementations also can be implemented in combination in a single implementation. Conversely, various features that are described in the context of a single implementation also can be implemented in multiple implementations separately or in any suitable subcombination. As such, although features may be described above as acting in particular combinations, and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one or more example processes in the form of a flowchart or flow diagram. However, other operations that are not depicted can be incorporated in the example processes that are schematically illustrated. For example, one or more additional operations can be performed before, after, simultaneously, or between any of the illustrated operations. In some circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

The following provides an overview of aspects of the present disclosure:

Aspect 1: An apparatus comprising: a frequency divider having a first frequency input coupled to a first oscillator frequency output, a second frequency input coupled to a complementary second oscillator frequency output, a first in-phase/quadrature (I/Q) divided frequency output, and a complementary second I/Q divided frequency output; and a first alternating current (AC) coupling capacitor between the first frequency input and the first oscillator frequency output and a second AC coupling capacitor between the second frequency input and the second oscillator frequency output.

Aspect 2: The apparatus of aspect 1, further comprising a first bias voltage source coupled to the first frequency input between the first AC coupling capacitor and the first frequency input through a series resistance.

Aspect 3: The apparatus of aspect 2, further comprising a second bias voltage source coupled to the second frequency input between the second AC coupling capacitor and the second frequency input through a series resistance, wherein a first bias voltage of the first bias voltage source and a second bias voltage of the second bias voltage source are independently regulatable.

Aspect 4: The apparatus of aspect 2 or 3, wherein the first bias voltage source comprises a current mirror having a variable reference current.

Aspect 5: The apparatus of any one or more of aspects 2-4, wherein the frequency divider comprises a first I/Q section coupled to the first frequency input and to the second frequency input to generate the first I/Q divided frequency output, the apparatus further comprising a third AC coupling capacitor between the second frequency input and a Q portion of the first I/Q section and a third bias voltage source coupled to the second frequency input between the third AC coupling capacitor and the Q portion of the first I/Q section through a series resistance, wherein a first bias voltage of the first bias voltage source and a third bias voltage of the third bias voltage source are independently regulatable.

Aspect 6: The apparatus of any one or more of aspects 1-5, further comprising a first transistor of a first type, wherein the first frequency input comprises a gate of the first transistor, the first transistor being coupled to a supply voltage at a first transistor source and the frequency divider at a first transistor drain.

Aspect 7: The apparatus of aspect 6, wherein the frequency divider comprises a plurality of inverters coupled to each other and wherein the first transistor drain is coupled to a bias current port of an inverter in an I portion of the frequency divider.

Aspect 8: The apparatus of aspect 6 or 7, further comprising a second transistor of a second type, wherein the second frequency input comprises a gate of the second transistor, the second transistor being coupled to the frequency divider at a second transistor drain and to ground at a second transistor source.

Aspect 9: The apparatus of aspect 8, wherein the frequency divider comprises a plurality of inverters coupled to each other and wherein the second transistor drain is coupled to a bias current of an inverter in a Q portion of the frequency divider.

Aspect 10: The apparatus of any one or more of aspects 1-9, further comprising a first input buffer between the first frequency input and the first oscillator frequency output and a second input buffer between the second frequency input and the second oscillator frequency output, wherein the first AC coupling capacitor is between the first input buffer and the first frequency input and the second AC coupling capacitor is between the second input buffer and the second frequency input.

Aspect 11: The apparatus of aspect 10, wherein the first input buffer comprises a series inverter and a feedback resistor coupled across the series inverter.

Aspect 12: A transceiver comprising: a digital to analog converter configured to convert data to be transmitted into I and Q analog output signals; a lowpass filter configured to remove undesired images from the I and Q output signals; an upconverter configured to upconvert the filtered I and Q output signals to a transmit frequency; an amplifier configured to amplify the upconverted I and Q signals to transmit; and a local oscillator signal generator coupled to the upconverter and configured to generate I and Q local oscillator signals for the upconverter, the local oscillator signal generator having a frequency divider having a plurality of oscillation inputs, a plurality of divided frequency outputs, and a plurality of alternating current (AC) coupling capacitors each connected to a respective input of the plurality of oscillator inputs.

Aspect 13: The transceiver of aspect 12, further comprising a voltage controlled oscillator (VCO) having outputs coupled to the plurality of oscillation inputs.

Aspect 14: The transceiver of aspect 12 or 13, wherein the local oscillator signal generator further comprises a plurality of bias voltage sources coupled to the oscillation inputs between the AC coupling capacitors and the oscillation inputs through respective series resistances.

Aspect 15: The transceiver of aspect 14, wherein a first bias voltage of a first bias voltage source and a second bias voltage of a second bias voltage source are configured to be independently regulated.

Aspect 16: The transceiver of any one or more of aspects 12-15, wherein the local oscillator signal generator further comprises a plurality of input buffers coupled between the VCO and the plurality of oscillation inputs.

Aspect 17: A method comprising: receiving a first local oscillator signal; coupling a first alternating current (AC) component of the first local oscillator signal to a first frequency input of a frequency divider through a first coupling capacitance; receiving a complementary second local oscillator signal; coupling a second AC component of the second local oscillator signal to a second frequency input of the frequency divider through a second coupling capacitance; dividing the first AC component to generate a first in-phase/quadrature (I/Q) divided frequency output; and dividing the second AC component to generate a complementary second I/Q divided frequency output.

Aspect 18: The method of aspect 17, further comprising: biasing the first frequency input to a first bias voltage between the first coupling capacitance and the first frequency input; and biasing the second frequency input to a second independently regulated bias voltage between the second coupling capacitance and the second frequency input.

Aspect 19: The method of aspect 18, further comprising regulating the first bias voltage in response to the first I/Q divided frequency output.

Aspect 20: The method of any one or more of aspects 17-19, further comprising buffering the first local oscillator signal with a first inverter and a first feedback resistor and buffering the second local oscillator signal with a second inverter and a second feedback resistor The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

Although selected aspects have been illustrated and described in detail, it will be understood that various substitutions and alterations may be made to the described embodiments, as defined by the following claims.

What is claimed:

1. An apparatus comprising:
   a frequency divider having a first frequency input coupled to a first oscillator frequency output, a second frequency input coupled to a complementary second oscillator frequency output, a first in-phase/quadrature (I/Q) divided frequency output, and a complementary second I/Q divided frequency output;
   a first alternating current (AC) coupling capacitor between the first frequency input and the first oscillator frequency output and a second AC coupling capacitor between the second frequency input and the second oscillator frequency output;
   a first bias voltage source coupled to the first frequency input between the first AC coupling capacitor and the first frequency input through a series resistance; and
   a second bias voltage source coupled to the second frequency input between the second AC coupling capacitor and the second frequency input through a series resistance, wherein a first bias voltage of the first bias voltage source and a second bias voltage of the second bias voltage source are independently regulatable.

2. The apparatus of claim 1, wherein the first bias voltage source comprises a current mirror having a variable reference current.

3. The apparatus of claim 1, wherein the frequency divider comprises a first I/Q section coupled to the first frequency input and to the second frequency input to generate the first I/Q divided frequency output, the apparatus further comprising a third AC coupling capacitor between the second frequency input and a Q portion of the first I/Q section and a third bias voltage source coupled to the second frequency input between the third AC coupling capacitor and the Q portion of the first I/Q section through a series resistance, wherein a first bias voltage of the first bias voltage source and a third bias voltage of the third bias voltage source are independently regulatable.

4. The apparatus of claim 1, wherein the apparatus comprises a transceiver, the transceiver further comprising:
   a digital to analog converter configured to convert data to be transmitted into I and Q analog output signals;
   a lowpass filter configured to remove undesired images from the I and Q output signals;
   an upconverter configured to upconvert the filtered I and Q output signals to a transmit frequency;
   an amplifier configured to amplify the upconverted I and Q signals to transmit; and
   a local oscillator signal generator coupled to the upconverter and configured to generate I and Q local oscillator signals for the upconverter, the local oscillator signal generator having the frequency divider.

5. The apparatus of claim 4, the transceiver further comprising a voltage controlled oscillator (VCO) having outputs coupled to the first frequency input and the second frequency input.

6. The apparatus of claim 5, wherein the local oscillator signal generator further comprises a plurality of input buffers respectively coupled between the VCO and the first frequency input and the second frequency input.

7. An apparatus, comprising:
   a frequency divider having a first frequency input coupled to a first oscillator frequency output, a second frequency input coupled to a complementary second oscillator frequency output, a first in-phase/quadrature (I/Q) divided frequency output, and a complementary second I/Q divided frequency output;
   a first alternating current (AC) coupling capacitor between the first frequency input and the first oscillator frequency output and a second AC coupling capacitor between the second frequency input and the second oscillator frequency output; and
   a first transistor of a first type, wherein the first frequency input comprises a gate of the first transistor, the first transistor being coupled to a supply voltage at a first transistor source and the frequency divider at a first transistor drain.

8. The apparatus of claim 7, wherein the frequency divider comprises a plurality of inverters coupled to each other and wherein the first transistor drain is coupled to a bias current port of an inverter in an I portion of the frequency divider.

9. The apparatus of claim 7, further comprising a second transistor of a second type, wherein the second frequency input comprises a gate of the second transistor, the second transistor being coupled to the frequency divider at a second transistor drain and to ground at a second transistor source.

10. The apparatus of claim 9, wherein the frequency divider comprises a plurality of inverters coupled to each other and wherein the second transistor drain is coupled to a bias current of an inverter in a Q portion of the frequency divider.

11. An apparatus, comprising:
    a frequency divider having a first frequency input coupled to a first oscillator frequency output, a second frequency input coupled to a complementary second oscillator frequency output, a first in-phase/quadrature (I/Q) divided frequency output, and a complementary second I/Q divided frequency output;
    a first alternating current (AC) coupling capacitor between the first frequency input and the first oscillator frequency output and a second AC coupling capacitor between the second frequency input and the second oscillator frequency output;
    a first input buffer between the first frequency input and the first oscillator frequency output; and
    a second input buffer between the second frequency input and the second oscillator frequency output, wherein the first AC coupling capacitor is between the first input buffer and the first frequency input and the second AC coupling capacitor is between the second input buffer and the second frequency input.

12. The apparatus of claim 11, wherein the first input buffer comprises a series inverter and a feedback resistor coupled across the series inverter.

13. A method comprising:
    receiving a first local oscillator signal;
    coupling a first alternating current (AC) component of the first local oscillator signal to a first frequency input of a frequency divider through a first coupling capacitance;
    receiving a complementary second local oscillator signal;

coupling a second AC component of the second local oscillator signal to a second frequency input of the frequency divider through a second coupling capacitance;

dividing the first AC component to generate a first in-phase/quadrature (I/Q) divided frequency output;

dividing the second AC component to generate a complementary second I/Q divided frequency output;

biasing the first frequency input to a first bias voltage between the first coupling capacitance and the first frequency input; and biasing the second frequency input to a second independently regulated bias voltage between the second coupling capacitance and the second frequency input.

14. The method of claim 13, further comprising regulating the first bias voltage in response to the first I/Q divided frequency output.

15. A method, comprising:

receiving a first local oscillator signal;

coupling a first alternating current (AC) component of the first local oscillator signal to a first frequency input of a frequency divider through a first coupling capacitance;

receiving a complementary second local oscillator signal;

coupling a second AC component of the second local oscillator signal to a second frequency input of the frequency divider through a second coupling capacitance;

dividing the first AC component to generate a first in-phase/quadrature (I/Q) divided frequency output;

dividing the second AC component to generate a complementary second I/Q divided frequency output; and buffering the first local oscillator signal with a first inverter and a first feedback resistor and buffering the second local oscillator signal with a second inverter and a second feedback resistor.

* * * * *